US009203360B2

(12) United States Patent
Kawagishi

(10) Patent No.: US 9,203,360 B2
(45) Date of Patent: Dec. 1, 2015

(54) AUDIO OUTPUT AMPLIFIER

(71) Applicant: Yamaha Corporation, Hamamatsu-shi (JP)

(72) Inventor: Norihiro Kawagishi, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 550 days.

(21) Appl. No.: 13/664,685

(22) Filed: Oct. 31, 2012

(65) Prior Publication Data
US 2013/0108080 A1  May 2, 2013

(30) Foreign Application Priority Data

Oct. 31, 2011  (JP) .................................. 2011-239063

(51) Int. Cl.
*H03F 3/187* (2006.01)
*H03F 3/68* (2006.01)
*H03F 3/45* (2006.01)

(52) U.S. Cl.
CPC ............ *H03F 3/187* (2013.01); *H03F 3/45475* (2013.01); *H03F 3/68* (2013.01); *H03F 2203/45138* (2013.01); *H03F 2203/45522* (2013.01); *H03F 2203/45528* (2013.01)

(58) Field of Classification Search
CPC ... H03F 3/68; H03F 3/72; H03F 2203/45138; H03F 2203/45522; H03F 2203/45528
See application file for complete search history.

(56) References Cited

U.S. PATENT DOCUMENTS

| 4,242,656 | A |  | 12/1980 | Forward et al. |
|---|---|---|---|---|
| 4,260,954 | A |  | 4/1981 | Crooks |
| 4,941,187 | A | * | 7/1990 | Slater .............................. 381/86 |
| 2008/0007337 | A1 |  | 1/2008 | North |
| 2008/0258811 | A1 |  | 10/2008 | North |
| 2008/0311986 | A1 | * | 12/2008 | Reiss et al. ....................... 463/35 |
| 2009/0147982 | A1 | * | 6/2009 | Ashida et al. ................. 381/384 |
| 2011/0032111 | A1 |  | 2/2011 | Gallavan |
| 2011/0103599 | A1 |  | 5/2011 | Li et al. |
| 2011/0148375 | A1 | * | 6/2011 | Tsuji ............................. 323/282 |

FOREIGN PATENT DOCUMENTS

| CN | 101212205 A | 7/2008 |
|---|---|---|
| CN | 102056054 A | 5/2011 |
| EP | 0 492 291 A1 | 7/1992 |
| JP | 64-2242 A | 1/1989 |
| JP | 9-37381 A | 2/1997 |

(Continued)

OTHER PUBLICATIONS

Japanese Office Action dated Apr. 7, 2015 with English translation (six pages).

(Continued)

*Primary Examiner* — Simon Sing
(74) *Attorney, Agent, or Firm* — Crowell & Moring LLP

(57) ABSTRACT

An audio output amplifier includes a plurality of amplification circuits that drive a plurality of electroacoustic conversion devices, respectively. Each of the plurality of amplification circuits includes a current detection resistance that is provided between a path of a current which is supplied to the corresponding electroacoustic conversion device; and a current controller that generates a voltage between both ends of the current detection resistance, the voltage being proportional to a voltage value of an audio input signal supplied to the corresponding amplification circuit.

3 Claims, 4 Drawing Sheets

(56) References Cited

FOREIGN PATENT DOCUMENTS

| JP | 2002-345064 A | 11/2002 |
| JP | 2004-266807 A | 9/2004 |
| JP | 2009-17610 A | 1/2009 |
| JP | 2009-530998 A | 8/2009 |
| JP | 2010-268188 A | 11/2010 |

OTHER PUBLICATIONS

Chinese Office Action and Search Report dated May 6, 2015 with English-language translation (seven (17) pages).

\* cited by examiner

AUDIO OUTPUT AMPLIFIER

BACKGROUND

1. Technical Field

The present invention relates to an audio output amplifier such as a headphone amplifier.

2. Background Art

In an audio reproduction system using a general headphone, as shown in FIG. 4, a headphone amplifier 1 and a headphone 2 are connected by an L channel signal line (3L), an R channel signal line (3R) and a GND wiring (3C) common to the L and R channels. The headphone amplifier 1 generates a driving voltage for an L channel speaker 2L in the headphone 2 provided between the L channel signal line 3L and the GND wiring 3C, based on an audio input signal of the L channel supplied from an audio source (not shown). Also, the headphone amplifier 1 generates a driving voltage for an R channel speaker 2R in the headphone 2 provided between the R channel signal line 3R and the GND wiring 3C, based on an audio input signal of the R channel supplied from the audio source. JP-A-2002-345064 discloses such headphone amplifier.

SUMMARY

According to the headphone amplifier 1 as mentioned above, a parasitic impedance existing in the GND wiring 3C becomes a common impedance of loads of the L and R channels seen from the headphone amplifier 1. Therefore, when the headphone amplifier 1 outputs the driving voltage of the L channel and the driving voltage of the R channel, a current based on the driving voltage of the L channel and a current based on the driving voltage of the R channel flow to the common impedance. An influence of a voltage drop, which is generated as the current based on the driving voltage of the L channel flows to the common impedance, appears in a voltage that is applied to the speaker 2R of the R channel. Further, an influence of a voltage drop, which is generated as the current based on the driving voltage of the R channel flows to the common impedance, appears in a voltage that is applied to the speaker 2L of the L channel. As a result, a channel separation is deteriorated, in that sound based on the audio signal of the L channel is emitted from not only the speaker 2L of the L channel but also the speaker 2R of the R channel and sound based on the audio signal of the R channel is emitted from not only the speaker 2R of the R channel but also the speaker 2L of the L channel.

The present invention has been made to solve the above problem. An object of the invention is to provide an audio output amplifier such as a headphone amplifier capable of improving channel separation.

An aspect of the present invention provides an audio output amplifier includes a plurality of amplification circuits that drive a plurality of electroacoustic conversion devices, respectively. Each of the plurality of amplification circuits includes a current detection resistance that is provided between a path of a current which is supplied to the corresponding electroacoustic conversion device; and a current controller that generates a voltage between both ends of the current detection resistance, the voltage being proportional to a voltage value of an audio input signal supplied to the corresponding amplification circuit.

According to the aspect of the invention, even when the respective current paths between the audio output amplifier and the respective electroacoustic conversion devices have the common impedance, the current proportional to the voltage value of the audio signal to each amplification circuit is supplied to the electroacoustic conversion device that is a load of the corresponding amplification circuit, irrespective of the voltage drop occurring in the common impedance. Therefore, it is possible to prevent the problem of the channel separation.

DETAILED DESCRIPTION

Hereinafter, embodiments of the invention will be described with reference to the accompanying drawings.

Figure 5:
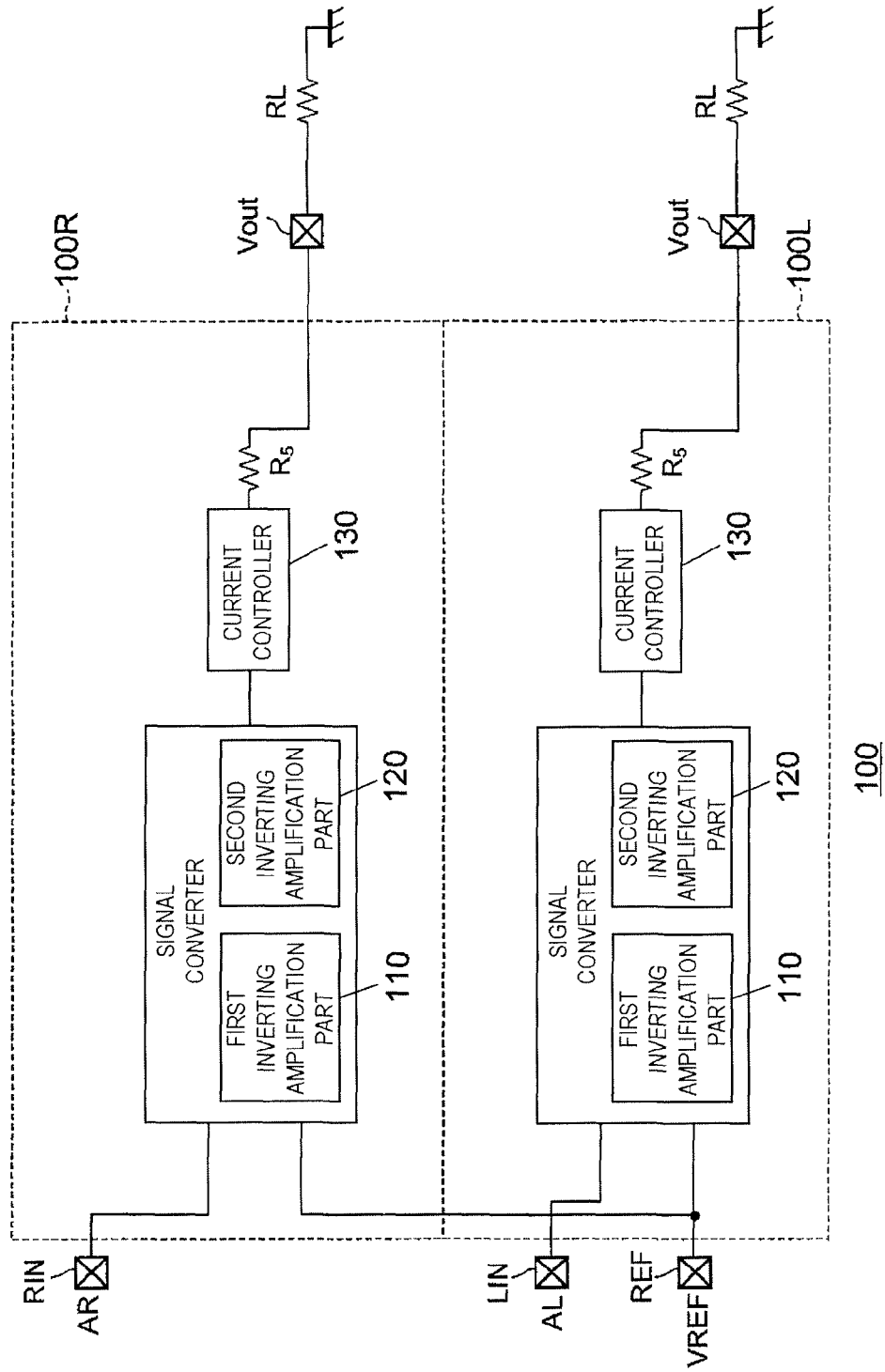
FIG. 5 is a block diagram showing a simple configuration of an audio output amplifier according to an aspect of the invention.

FIG. 5 is a block diagram showing a simple configuration of an audio output amplifier according to an aspect of the invention. An audio output amplifier 100 includes amplification circuits 100R, 100L that output voltages VOUT and are connected to a load resistance RL. The load resistance RL indicates total resistances of the loads connected to the output of each of the amplification circuits 100R, 100L. Each of the amplification circuits 100R, 100L includes a current detection resistance R5 that is provided between a path of a current which flows to the load resistance RL, and a current controller 130 that generates a voltage between both ends of the current detection resistance R5, the voltage being proportional to a voltage value of an audio input signal supplied to the corresponding amplification circuit.

Each of the amplification circuits 100R, 100L may further include a signal converter that may be configured by a first inverting amplification part 110 and a second inverting amplification part 120. The signal converter is not essential to implement the present invention, and the current controller 130 may not receive signals from the signal converter, but receive them from another device. The signal converter may convert the audio input signal supplied to the corresponding amplification circuit 100R, 100L to a first phase audio signal and a second phase audio signal which have a voltage difference proportional to a difference between the voltage value of the audio input signal supplied to the corresponding amplification circuit 100R, 100L and a reference voltage VREF. The current controller generates a voltage between the both ends of the current detection resistance R5, the voltage being proportional to the voltage difference between the first phase audio signal and the second phase audio signal output by the signal converter.

<First Embodiment>

Figure 1:
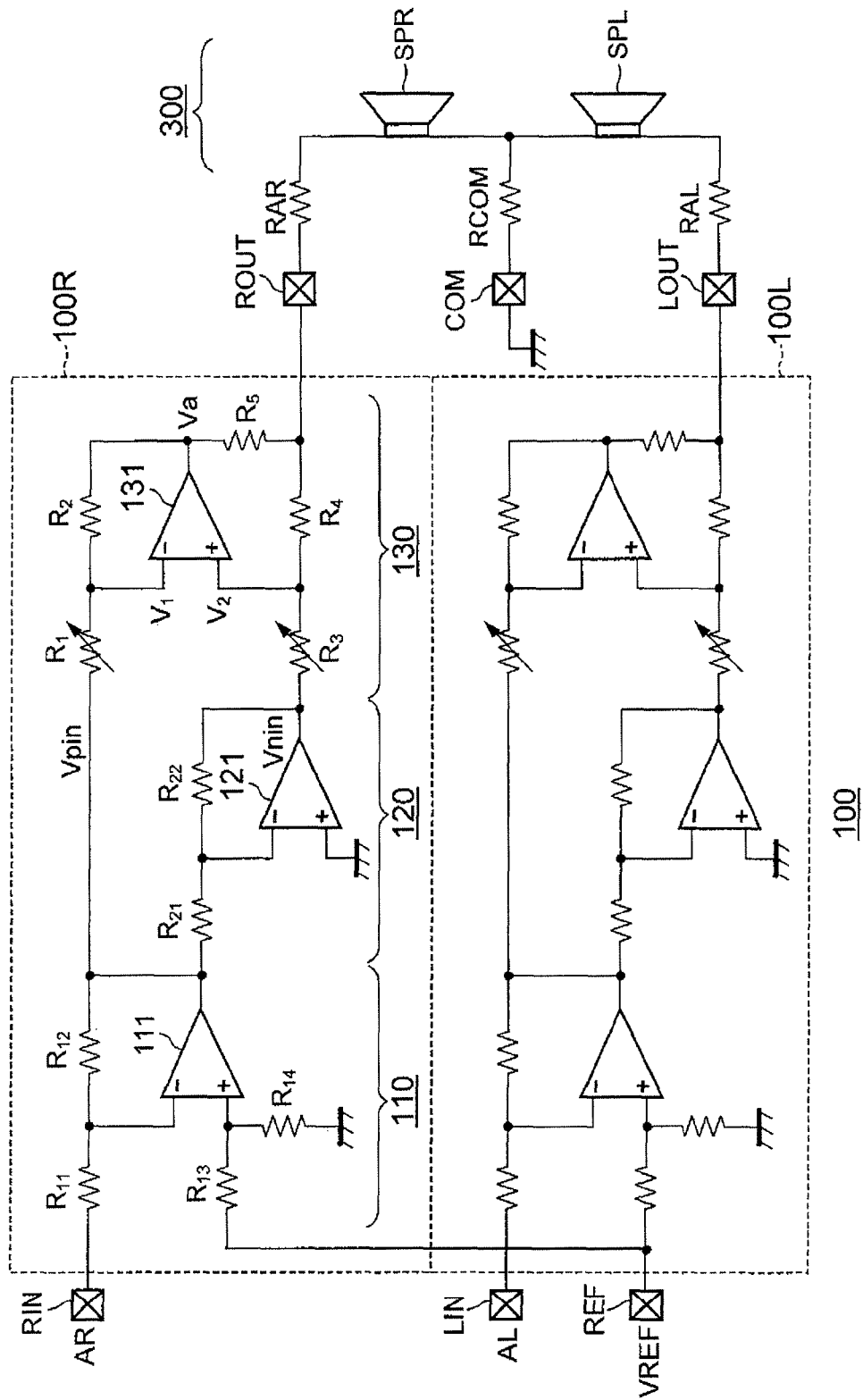
FIG. 1 is a circuit diagram showing a configuration of an audio reproduction system including a headphone amplifier, which is an example of an audio output amplifier according to a first embodiment of the invention, and a headphone that is driven by the headphone amplifier.

FIG. 1 is a circuit diagram showing a configuration of an audio reproduction system including a headphone amplifier 100, which is an example of an audio output amplifier according to a first embodiment of the invention, and a headphone 300 that is driven by the headphone amplifier 100.

The headphone amplifier 100 of this embodiment has an amplification circuit 100L for an L channel and an amplification circuit 100R for an R channel. The amplification circuit 100L for an L channel is input with an L channel audio input signal AL through an audio input terminal LIN for an L channel. The amplification circuit 100R for an R channel is input with an R channel audio input signal AR through an audio input terminal RIN for an R channel. Also, both the amplification circuit 100L for an L channel and the amplification circuit 100R for an R channel are input with a reference voltage VREF through a reference voltage input terminal REF.

The headphone amplifier 100 has an L channel audio output terminal LOUT, an R channel audio output terminal ROUT and a common terminal COM. Here, the common terminal COM is pounded in the headphone amplifier 100. In the headphone amplifier 100, the amplification circuit 100L for an L channel drives a load connected between the L channel audio output terminal LOUT and the common terminal COM, based on the L channel audio input signal AL. Also, in the headphone amplifier 100, the amplification circuit 100R for an R channel drives a load connected between the R channel audio output terminal ROUT and the common terminal COM, based on the R channel audio input signal AR.

Figure 4:
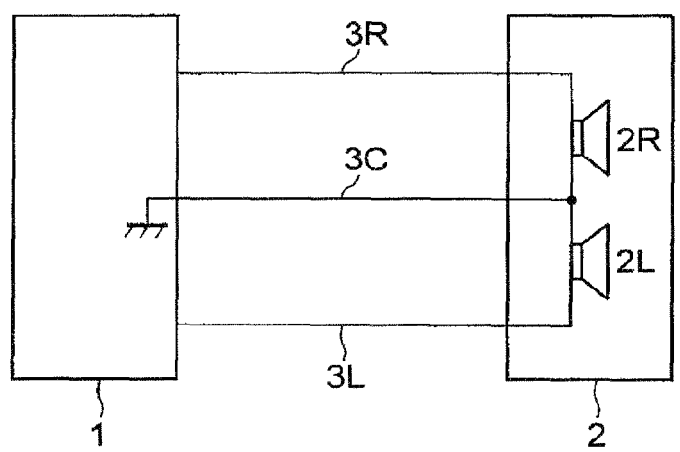
FIG. 4 is a block diagram showing a configuration of an audio reproduction system having a general headphone amplifier and a headphone.

The L channel audio output terminal LOUT, the R channel audio output terminal ROUT and the common terminal COM are connected to the headphone 300 through an L channel signal line, an R channel signal line and a common GND wiring, like the configuration shown in FIG. 4. The headphone 300 has a speaker SPL for an L channel and a speaker SPR for an R channel, which are electroacoustic conversion devices. A resistance RAL, the speaker SPL for an L channel and a resistance RCOM, which are loads, are connected in series between the L channel audio output terminal LOUT and the common terminal COM. Also, a resistance RAR, the speaker SPR for an R channel and the resistance RCOM, which are loads, are connected in series between the R channel audio output terminal ROUT and the common terminal COM. Here, the resistance RCOM is a resistance of the GND wiring that is a common part of a current path between the L channel audio output terminal LOUT and the common terminal COM and a current path between the R channel audio output terminal ROUT and the common terminal COM. Also, the resistance RAL is a resistance obtained by excluding the resistance RCOM of the common part and a resistance of the speaker SPL from an entire resistance of the current path between the L channel audio output terminal LOUT and the common terminal COM. Also, the resistance RAR is a resistance obtained by excluding the resistance RCOM of the common part and a resistance of the speaker SPR from an entire resistance of the current path between the R channel audio output terminal ROUT and the common terminal COM.

The amplification circuit 100R for an R channel has a first inverting amplification part 110, a second inverting amplification part 120 and a current controller 130. In the below, configurations of the first inverting amplification part 110, the second inverting amplification part 120 and the current controller 130 are described.

First, the first inverting amplification part 110 has an operational amplifier 111 and resistances $R_{11}$ to $R_{14}$. Here, the resistance $R_{11}$ is provided between the R channel audio input terminal RIN and an inverting input terminal (−input terminal) of the operational amplifier 111 and the resistance $R_{12}$ is provided between the inverting input terminal and an output terminal of the operational amplifier 111. A non-inverting input terminal (+input terminal) of the operational amplifier 111 is given with a reference voltage Vr obtained by dividing the reference voltage VREF by the resistances ($R_{13}$ and $R_{14}$) (Vr=kVREF ($k=R_{14}/(R_{13}+R_{14})$)). In the first inverting amplification part 110, an audio signal Vpin ($=-(R_{12}/R_{11})(AR-Vr)$) of a first phase, which is obtained by inverting and amplifying a difference between the R channel audio input signal AR and the reference voltage Vr, is output from the operational amplifier 111.

Next, the second inverting amplification part 120 has an operational amplifier 121 and resistances $R_{21}$ and $R_{22}$. Here, the resistance $R_{21}$ is provided between the output terminal of the operational amplifier 111 and an inverting input terminal of the operational amplifier 121 and the resistance $R_{22}$ is provided between the inverting input terminal and an output terminal of the operational amplifier 121. A non-inverting input terminal of the operational amplifier 121 is grounded. In the second inverting amplification part 120, an audio signal Vnin ($=-(R_{22}/R_{21})$Vpin) of a second phase, which is obtained by inverting and amplifying the audio signal Vpin of the first phase, is output from the operational amplifier 121.

In this embodiment, a ratio ($R_{22}/R_{21}$) of the resistance values of the resistances $R_{21}$ and $R_{22}$ of the second inverting amplification part 120 is 1. Therefore, the audio signal Vpin of the first phase and the audio signal Vnin of the second phase become balanced differential signals having a voltage difference proportional to a difference between the R channel audio input signal AR and the reference voltage Vr.

The first inverting amplification part 110 and the second inverting amplification part 120 configure a signal converter that generates the balanced differential signals consisting of the audio signal Vpin of the first phase and the audio signal Vnin of the second phase, based on the R channel audio input signal AR and the reference voltage VREF.

Next, the current controller 130 has an operational amplifier 131 and resistances $R_1$ to $R_5$. Here, the resistance R1 is provided between the output terminal of the operational amplifier 111 and an inverting input terminal of the operational amplifier 131 and the resistance $R_2$ is provided between the inverting input terminal and the output terminal of the operational amplifier 131. The resistance R3 is provided between the output terminal of the operational amplifier 121 and a non-inverting input terminal of the operational amplifier 131 and the resistance $R_4$ is provided between the non-inverting input terminal of the operational amplifier 131 and the R channel audio output terminal ROUT. The resistance $R_5$, which is a current detection resistance, is provided between the output terminal of the operational amplifier 131 and the R channel audio output terminal ROUT.

In the current controller 130, the resistances $R_1$ and $R_3$ are variable resistances and resistance values thereof are adjusted by an operation of a common operator, for example. At this time, the resistances $R_1$ and $R_3$ are adjusted to have the same resistance value. Also, the resistances $R_2$ and $R_4$ have the same resistance value. Also, in this embodiment, the resistance $R_5$ has a resistance value sufficiently smaller than the resistances $R_2$ and $R_4$.

The amplification circuit 100R for an R channel has the above-described configuration. The amplification circuit 100L for an L channel also has the same configuration as the amplification circuit 100R for an R channel.

Subsequently, operations of this embodiment are described with reference to FIGS. 2A to 2D. In FIGS. 2A and 2B, a resistance RL is a total of the resistance RAR, the resistance of the speaker SPR and the resistance RCOM in FIG. 1.

First, it is assumed that a voltage value of the R channel audio signal AR is smaller than the reference voltage Vr, the voltage Vpin of the audio signal of the first phase is positive (+) and the voltage Vnin of the audio signal of the second phase is negative (−). In this case, the respective currents shown in FIG. 2A flow to the respective parts of the current controller 130. Also, in this case, a relation of the voltages (Vpin, Vnin, $V_1$, $V_2$, Va and Vout) of the respective nodes of the current controller 130 is as shown in FIG. 2C.

As shown in FIG. 2A, when the voltage Vpin is positive (+), the current flows from the node, in which the voltage Vpin is generated, toward the output terminal of the operational amplifier 131 through the resistances $R_1$ and $R_2$. When this current is indicated by Ipin, the voltage $V_1$ of the inverting input terminal of the operational amplifier 131 is a voltage that is dropped from the voltage Vpin by a voltage $IpinR_1$ and an output voltage Va of the operational amplifier 131 is a voltage that is dropped from the voltage $V_1$ by a voltage $IpinR_2$.

Figure 2C:
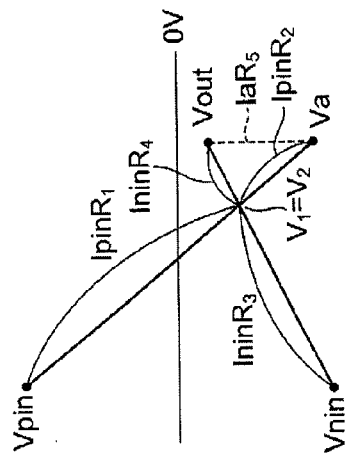
FIGS. 2A to 2D show operations of the first embodiment.

Here, as shown in FIG. 2C, since the voltage $V_1$ is a voltage obtained by internally dividing a difference of the voltages Vpin and Va by a ratio of the resistances $R_1$ and $R_2$, the voltage is as follows:

$$V_1 = (R_1/(R_1+R_2))(Va-Vpin)+Vpin \quad (1)$$
$$= (R_1Va+R_2Vpin)/(R_1+R_2)$$

Also, when the voltage Vnin is negative (−), the current flows from the R channel audio output terminal ROUT toward the node, in which the voltage Vnin is generated, through the resistances $R_4$ and $R_3$. When this current is indicated by Inin, the voltage $V_2$ of the non-inverting input terminal of the operational amplifier 131 is a voltage that is increased from the voltage Vnin by a voltage $IninR_3$ and a voltage Vout of the R channel audio output terminal ROUT is a voltage that is increased from the voltage $V_2$ by a voltage $IninR_4$.

Here, as shown in FIG. 2C, since the voltage $V_2$ is a voltage obtained by internally dividing a difference of the voltages Vnin and Vout by a ratio of the resistances $R_3$ and $R_4$, the voltage is as follows:

$$V_2 = (R_3/(R_3+R_4))(Vout-Vnin)+Vnin \quad (2)$$
$$= (R_3Vout+R_4Vnin)/(R_3+R_4)$$

The current Ia proportional to a voltage difference (Vout−Va) between the voltage Vout of the R channel audio output terminal ROUT and the output voltage Va of the operational amplifier 131 flows to the resistance $R_5$. Here, since the operational amplifier 131 is applied with a negative feedback through the resistance $R_2$, the operational amplifier 131 outputs a voltage Va enabling the voltage $V_1$ to the inverting input terminal to match the voltage $V_2$ to the non-inverting input terminal, as shown in FIG. 2C.

The voltage Va can be calculated as follows. First, in the equations (1) and (2), a following equation should be satisfied so that $V_1=V_2$.

$$(R_1Va+R_2Vpin)/(R_1+R_2)=(R_3Vout+R_4Vnin)/(R_3+R_4) \quad (3)$$

In the equation (3), when $R_1=R_3=Ra$ and $R_2=R_4=Rb$, a following equation is obtained.

$$(RaVa+RbVpin)/(Ra+Rb)=(RaVout+RbVnin)/(Ra+Rb) \quad (4)$$

The equation (4) can be modified as follows.

$$Va-Vout=-(Rb/Ra)(Vpin-Vnin) \quad (5)$$

Like this, in the current control unit 130, the voltage difference proportional to the voltage difference between the differential signals Vpin and Vnin is generated between the voltages Va and Vout. Therefore, as shown in a following equation, the current Ia proportional to the voltage difference between the differential signals Vpin and Vnin flows to the resistance R3.

$$Ia = (Va-Vout)/R_5 \quad (6)$$
$$= -(Rb/(RaR_5))(Vpin-Vnin)$$

Here, the resistance $R_5$ has a resistance value that is sufficiently smaller than the resistances $R_2$ and $R_4$. Therefore, the current Inin becomes a current value that is negligibly small, compared to the current Ia. Thus, the current (Iout−Ia) that is the substantially same as Ia of the equation (6) flows to the load RL connected to the R channel audio output terminal ROUT.

Figure 2D:
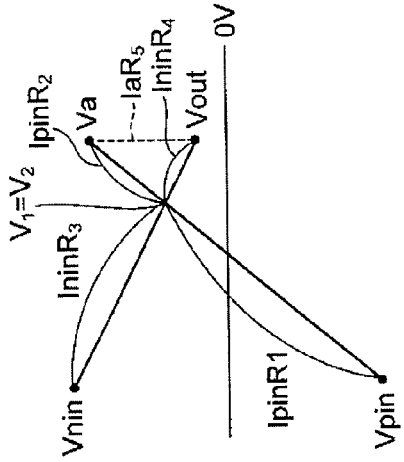
Figure 2A:
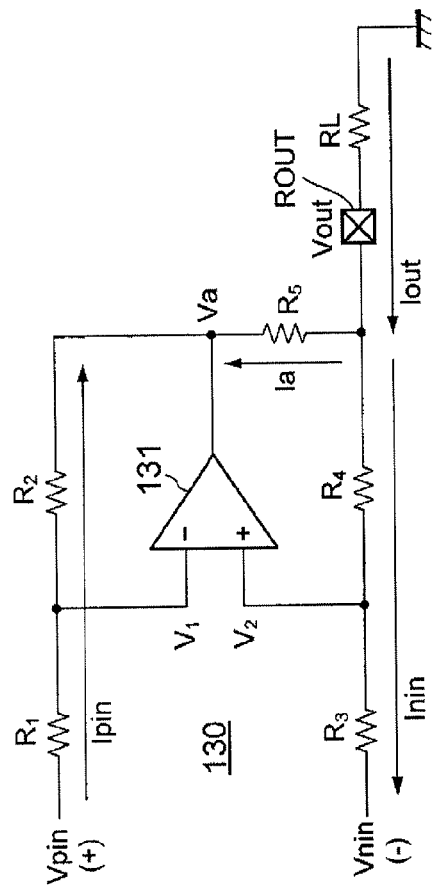
Figure 2B:
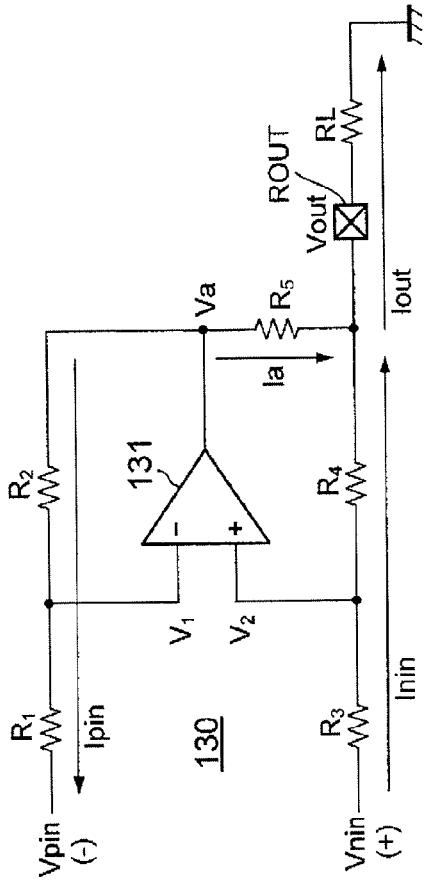

When a voltage value of the R channel audio signal AR is larger than the reference voltage Vr, the voltage Vpin is negative (−) and the voltage Vnin is positive (+), the respective currents shown in FIG. 2B flow to the respective parts of the current controller 130. Also, in this case, a relation of the voltages (Vpin, Vnin, $V_1$, $V_2$, Va and Vout) of the respective nodes of the current controller 130 is as shown in FIG. 2D.

This case is the same as the case where the voltage Vpin is positive (+) and the voltage Vnin is negative (−). Thus, the current Ia proportional to the voltage difference between the differential signals Vpin and Vnin flows to the resistance $R_5$ and the current Iout that is the substantially same as the current Ia flows to the load RL connected to the R channel audio output terminal ROUT.

According to the amplification circuit 100R for an R channel configured as described above, the differential signals Vpin and Vnin having a voltage difference proportional to the voltage difference between the R channel audio signal AR and the reference voltage Vr are generated and the current Iout proportional to the voltage difference of the differential signals Vpin and Vnin flows from the current controller 130 to the load RL connected to the R channel audio output terminal ROUT.

Although the operations of the amplification circuit 100R for an R channel has been exemplified, the amplification circuit 100L for an L channel also operates in the same manner. In the amplification circuit 100L for an L channel, the differential signals Vpin and Vnin having a voltage difference proportional to the voltage difference between the L channel audio signal AL and the reference voltage Vr are generated and the current Iout proportional to the voltage difference of the differential signals Vpin and Vnin flows from the current controller 130 to the load connected to the L channel audio output terminal LOUT.

Like this, according to the headphone amplifier of this embodiment, the current relating to the R channel audio signal AR is supplied to the load connected to the R channel audio output terminal ROUT and the current relating to the L channel audio signal AL is supplied to the load connected to the L channel audio output terminal LOUT. Therefore, even when the common impedance intervenes between the current path of the R channel audio output terminal ROUT and the common terminal COM and the current path of the L channel audio output terminal LOUT and the common terminal COM, it is possible to prevent an influence of the L channel audio signal AL from appearing in the reproduced sound of the R channel speaker SPR and an influence of the R channel audio signal AR from appearing in the reproduced sound of the L channel speaker SPL, thereby improving the channel separation. In this embodiment, the current is controlled instead of the voltage control. When the common impedance intervenes and the ground voltage fluctuates, the current applied to the speaker becomes constant. Thus, the energy emitted from each of the speakers in one path does not depend on the output from the other path, but is controlled only by the head phone amplifier, thereby improving the channel separation.

<Second Embodiment>

In general, an output of a headphone depends on an output voltage of a headphone amplifier. Therefore, in a general headphone amplifier, a volume of the headphone is adjusted by adjusting the output voltage. However, in the first embodiment, the current proportional to the voltage value of the analog audio input signal is enabled to flow to the speakers of the headphone. Therefore, the output voltage of the headphone amplifier may deviate from a voltage corresponding to a proper volume, depending on the impedances of the speakers of the headphone. Thus, in this embodiment, the headphone amplifier is provided with a means for adjusting the resistance value Ra of the variable resistances $R_1$ and $R_3$ of the amplification circuit 100R for an R channel and the amplification circuit 100L for an L channel so that an output voltage of the headphone amplifier becomes a voltage corresponding to a proper volume.

Figure 3:
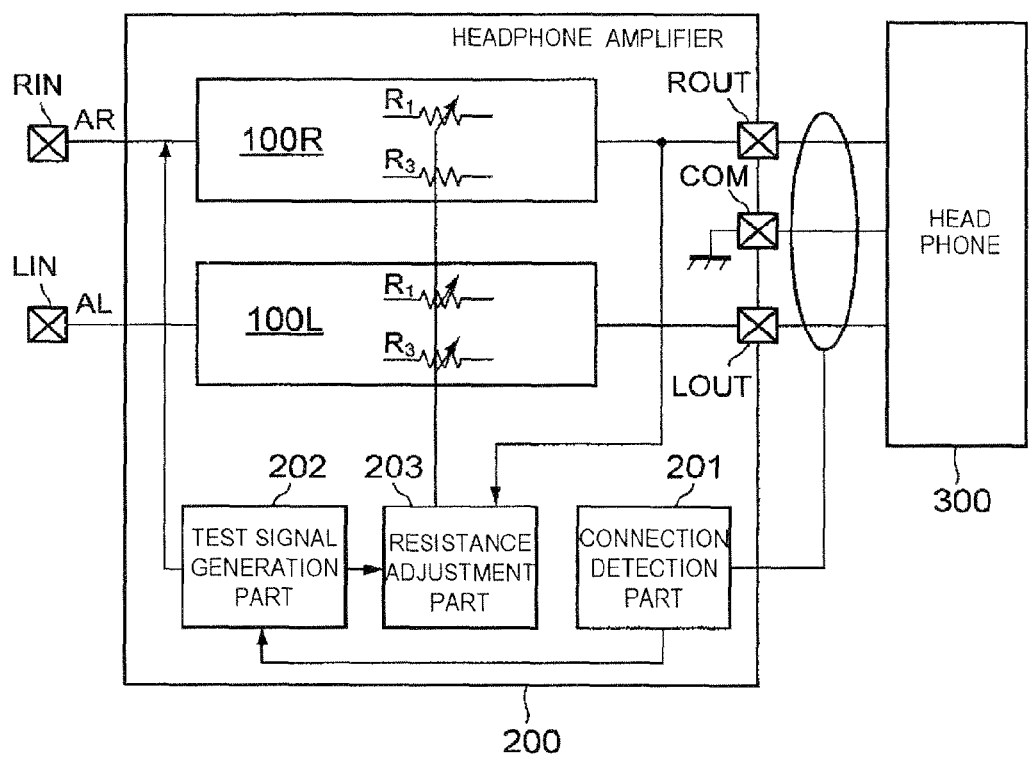
FIG. 3 is a block diagram showing a configuration of a headphone amplifier according to a second embodiment of the invention.

FIG. 3 is a block diagram showing a configuration of a headphone amplifier 200 according to this embodiment. In this embodiment, the headphone amplifier 200 has a connection detection part 201, a test signal generation part 202 and a resistance adjustment part 203, compared to the headphone amplifier 100 of the first embodiment. Here, the connection detection part 201 is a circuit detecting that the headphone 300 is connected to the headphone amplifier 200. The test signal generation part 202 is a circuit that, when the connection detection part 201 detects that the headphone 300 is connected to the headphone amplifier 200, provides one of the R channel audio input terminal RIN and the L channel audio input terminal LIN (in the shown example, the R channel audio input terminal RIN) with a test signal beyond an audible band for a predetermined time period. The resistance adjustment part 203 is a circuit that, while the test signal generation part 202 outputs the test signal, measures an output voltage of the audio output terminal (in the shown example, the R channel audio output terminal ROUT) of one of the amplification circuit 100R for an R channel and the amplification circuit 100L for an L channel, to which the test signal is input, and adjusts the resistance value Ra of the variable resistances R1 and R3 of the amplification circuit 100R for an R channel and the amplification circuit 100L for an L channel so that the output voltage becomes a voltage corresponding to a proper volume.

Also in this embodiment, it is possible to obtain the same effects as the first embodiment. Also, according to this embodiment, it is possible to set the proper volume of the headphone 300 even under situations where the impedances of the speakers of the headphone 300 are different, depending on the headphone 300.

Although the first and second embodiments of the invention have been described, the other embodiments are also possible. Some examples are described as follows, (1) In the above embodiments, the invention has been applied to the headphone amplifier. However, the invention can be also applied to the other audio output amplifier that drives a plurality of electroacoustic conversion devices through a plurality of signal lines and a common GND wiring.

(2) In the above embodiments, regarding the audio signal Vpin of the first phase and the audio signal Vnin of the second phase, the differential signals that are positive and negative symmetric based on the symmetrical axis of 0V are generated. However, any audio signals of the first and second phases may be used insomuch as a voltage difference therebetween is proportional to a difference between the voltage value of the audio input signal of the L channel or R channel and the reference voltage.

(3) In the above embodiments, the common connection point of the resistance $R_4$ and the resistance $R_5$ is directly connected to the audio output terminal. However, a device such as resistance may be interposed between the common connection point of the resistance $R_4$ and the resistance $R_5$ and the audio output terminal.

(4) In the second embodiment, the test signal is supplied to the R channel audio input terminal RIN and the variable resistances $R_1$ and $R_3$ of the amplification circuit 100R for an R channel and the amplification circuit 100L for an L channel are adjusted based on the output voltage of the R channel audio output terminal ROUT. However, instead of this configuration, a following configuration is also possible. First, the test signal is supplied to the R channel audio input terminal RIN and the variable resistances $R_1$ and $R_3$ of the amplification circuit 100R for an R channel are adjusted based on the output voltage of the R channel audio output terminal ROUT. Then, the test signal is supplied to the L channel audio input terminal LIN and the variable resistances $R_1$ and $R_3$ of the amplification circuit 100L for an L channel are adjusted based on the output voltage of the L channel audio output terminal LOUT. According to this configuration, when the load resistance of the L channel and the load resistance of the R channel, which are seen from the headphone amplifier, are unbalanced, it is possible to appropriately adjust the variable resistances $R_1$ and $R_3$ of each of the amplification circuit 100R for an R channel and the amplification circuit 100L for an L channel, in correspondence to the respective load resistances.

The present application is based upon and claims the benefit of priority of Japanese Patent Application No. 2011-239063 filed on Oct. 31, 2011, the contents of which are incorporated herein by reference in its entirety.

What is claimed is:

1. An audio output amplifier, comprising:
   a plurality of amplification circuits that drive a plurality of electroacoustic conversion devices, respectively, wherein
   each of the plurality of amplification circuits includes:
   a current detection resistance that is provided between a path of a current which is supplied to the corresponding electroacoustic conversion device; and
   a current controller that generates a voltage between both ends of the current detection resistance, the voltage being proportional to a voltage value of an audio input signal supplied to the corresponding amplification circuit, wherein
   each of the plurality of amplification circuits further includes a signal converter that converts the audio input signal supplied to the corresponding amplification circuit to a first phase audio signal and a second phase audio signal which have a voltage difference proportional to a difference between the voltage value of the audio input signal supplied to the corresponding amplification circuit and a reference voltage, wherein
   the current controller in each of the plurality of amplification circuits generates a voltage between the both ends of the current detection resistance, the voltage being proportional to the voltage difference between the first phase audio signal and the second phase audio signal output by the signal converter of the corresponding amplification circuit; and the current controller includes:

an operational amplifier having an inverting input terminal, a non-inverting input terminal and an output terminal;

a first resistance that is provided between a node to which the first phase audio signal is output and the inverting input terminal of the operational amplifier;

a second resistance that is provided between the inverting input terminal of the operational amplifier and the output terminal of the operational amplifier;

a third resistance that is provided between a node to which the second phase audio signal is output and the non-inverting input terminal of the operational amplifier; and a fourth resistance that is provided between the non-inverting input terminal of the operational amplifier and the corresponding electroacoustic conversion device, wherein the current detection resistance has one end connected to the output terminal of the operational amplifier and the other end connected to an end of the fourth resistance at a side of the electro acoustic conversion device.

2. The audio output amplifier according to claim 1, wherein the first resistance and the third resistance are variable resistances.

3. The audio output amplifier according to claim 2, further comprising:

a connection detection part that detects a connection of the plurality of electroacoustic conversion devices to the plurality of amplification circuits;

a test signal generation part that provides at least one amplification circuit of the plurality of amplification circuits with a test signal beyond an audible band when the connection detection part detects the connection of the plurality of electroacoustic conversion devices to the plurality of amplification circuits; and a resistance adjustment part that adjusts resistance values of the first and third resistances to cause a voltage output from the amplification circuit with which the test signal is provided to the corresponding electroacoustic conversion device to be a predetermined voltage.

* * * * *